United States Patent
Thoma

(10) Patent No.: US 11,848,150 B2
(45) Date of Patent: Dec. 19, 2023

(54) TRANSFORMER ARRANGEMENT, CIRCUIT ARRANGEMENT AND METHOD FOR OPERATING A TRANSFORMER ARRANGEMENT

(71) Applicant: Advantest Corporation, Tokyo (JP)

(72) Inventor: Anton Thoma, Munich (DE)

(73) Assignee: Advantest Corporation, Tokyo (JP)

( * ) Notice: Subject to any disclaimer, the term of this patent is extended or adjusted under 35 U.S.C. 154(b) by 563 days.

(21) Appl. No.: 16/847,406

(22) Filed: Apr. 13, 2020

(65) Prior Publication Data

US 2020/0243256 A1 Jul. 30, 2020

Related U.S. Application Data

(63) Continuation of application No. PCT/EP2018/051232, filed on Jan. 18, 2018.

(51) Int. Cl.
| | | |
|---|---|---|
| H01F 27/38 | (2006.01) | |
| H01F 38/30 | (2006.01) | |
| G01R 15/18 | (2006.01) | |
| H01F 27/28 | (2006.01) | |
| H01F 27/42 | (2006.01) | |
| H01F 38/32 | (2006.01) | |
| G05F 1/14 | (2006.01) | |

(52) U.S. Cl.
CPC ........... *H01F 38/30* (2013.01); *G01R 15/185* (2013.01); *G05F 1/14* (2013.01); *H01F 27/2823* (2013.01); *H01F 27/38* (2013.01); *H01F 27/425* (2013.01); *H01F 27/427* (2013.01); *H01F 38/32* (2013.01)

(58) Field of Classification Search
CPC ...... H01F 38/30; H01F 27/2823; H01F 27/38; H01F 27/425; H01F 27/427; H01F 38/32; H01F 2027/2819; H01F 27/42; H01F 27/2804; G01R 15/185; G05F 1/14
See application file for complete search history.

(56) References Cited

U.S. PATENT DOCUMENTS

| | | | |
|---|---|---|---|
| 5,615,091 A | 3/1997 | Palatnik | |
| 6,023,214 A * | 2/2000 | Ohta | ................... H01F 27/2804 336/84 R |

(Continued)

FOREIGN PATENT DOCUMENTS

JP 2014229894 A 12/2014

*Primary Examiner* — Tuyen T Nguyen

(57) ABSTRACT

A transformer arrangement comprises a primary winding and a secondary winding, which are magnetically coupled. The transformer arrangement also comprises a compensating arrangement, which is circuited to provide a link between a terminal of the primary winding and a terminal of the secondary winding. The compensating arrangement is configured such that a change of a magnetic flux through the primary winding and the secondary winding induces a voltage in the compensating arrangement. The compensating arrangement comprises at least one coupling capacitor configured to block a DC current and to pass a current caused by the induced voltage. The compensating arrangement is configured to at least partially compensate a current that is caused by an inter-winding capacitance between the primary winding and the secondary winding using the current caused by the induced voltage.

17 Claims, 8 Drawing Sheets

(56) References Cited

U.S. PATENT DOCUMENTS

| | | | |
|---|---|---|---|
| 7,768,369 B2 * | 8/2010 | Park | H01F 41/064 |
| | | | 336/84 C |
| 7,868,724 B2 | 1/2011 | Sicong et al. | |
| 2004/0145439 A1 | 7/2004 | Grilo et al. | |
| 2009/0251273 A1 | 10/2009 | Park | |
| 2010/0202160 A1 | 8/2010 | Kim et al. | |
| 2010/0289610 A1 * | 11/2010 | Jacobson | H01F 27/2885 |
| | | | 336/84 C |
| 2014/0347159 A1 | 11/2014 | Zuo et al. | |
| 2017/0012548 A1 | 1/2017 | Sakuno et al. | |

* cited by examiner

Fig.2.3:a) effective common surface area between two non-shifted planar tracks b) effective common surface area between two shifted planar tracks

TRANSFORMER ARRANGEMENT, CIRCUIT ARRANGEMENT AND METHOD FOR OPERATING A TRANSFORMER ARRANGEMENT

CROSS-REFERENCES TO RELATED APPLICATIONS

This application is a continuation of copending International Application No. PCT/EP2018/051232, filed Jan. 18, 2018, which is incorporated herein by reference in its entirety.

TECHNICAL FIELD

Embodiments according to the invention related to a transfer arrangement, a circuit arrangement and method for operating a transformer arrangement. Embodiments according to this invention refer to a common mode noise cancellation of planar transformer.

BACKGROUND OF THE INVENTION

Planar transformers are used for DC/DC (DC means direct current) power conversion to provide level translation, energy transfer or electrical isolation purpose. In planar transformers the windings are realized as copper traces to form the necessary windings. The windings are separated by PCB (printed circuit board) isolating material. In operation, the windings are alternating the voltage level. The proximity of the primary to the secondary windings causes capacitive coupling between input and output of the transformer. This generates an AC (AC means alternating current) current flow, which is seen as common mode noise between a primary and a secondary side of the transformer. Common mode noise reduces the performance of a secondary side supply circuitry.

Therefore, it is desired to get a concept which makes a better compromise between reduction of common mode noise, efficiency and costs.

SUMMARY OF HE INVENTION

An embodiment according to this invention is related to a transformer arrangement comprising a primary winding and a secondary winding. The primary winding and the secondary winding are magnetically coupled. The transformer arrangement also comprises a compensating arrangement. The compensating arrangement is circuited (circuited can also be understood as arranged or configured) to provide a link (this can be, for example, an AC link or, for example, a DC blocking AC link) between a terminal of the primary winding and a terminal of the secondary winding. The compensating arrangement of the transformer arrangement is configured such that a change of a magnetic flux through the primary winding and the secondary winding induces a voltage in the compensating arrangement (for example, along a wire). The compensating arrangement also comprises at least one coupling capacitor (which is, for example, series connected) configured to block a DC current (for example, between the terminal of the primary winding and the terminal of the secondary winding, or along the link) and to pass a current caused by the induced voltage (for example, a current flowing towards the terminal of the secondary winding). The compensating arrangement is configured to at least partially compensate a parasitic current (respectively, common mode noise) that is caused by an inter-winding capacitance between the primary winding and the secondary winding using the current caused by the induced voltage.

Thus, the common mode noise can be reduced significantly without significantly increasing the number of components or the size of the transformer.

This embodiment is based on the idea that it is efficient to counteract a common mode noise, which is caused by a parasitic capacitive coupling between the primary winding and the secondary winding, using a compensating arrangement which provides an AC link between a terminal of the primary winding and a terminal of the secondary winding and which is affected by a change of the common magnetic flux through the primary winding and the secondary winding, because a current caused by the voltage induced within the compensating arrangement and flowing through the coupling capacitor can be tuned to counteract a current caused by the parasitic coupling between the primary winding and the secondary winding. Accordingly, the current flowing through the compensating arrangement effectively reduces a common mode distortion at the secondary side because it at least partially compensates a current caused by the parasitic capacitance between the primary winding and the secondary winding. It has been found that a phase of the current caused in such a compensating arrangement, which comprises a conductor extending between a terminal of the first winding and a terminal of the second winding and a series coupling capacitor, is well suited to reduce the common mode distortions. For example, the phase of the voltage induced in the compensation arrangement is typically in a fixed (or approximately fixed) phase relationship with the input voltage applied to the primary winding, and the series coupling capacitor has the effect that the current injected into the terminal of the secondary winding by the compensating arrangement is substantially 180 degree out-of-phase when compared to a current caused by the parasitic capacitance between the primary and the secondary winding. An absolute value of the current injected (or provided) by the compensating arrangement can, for example, be adjusted with good accuracy by a proper choice of a capacitance value of the coupling capacitor (wherein, for example, an absolute value of the current injected by the coupling capacitor can be set to differ from the current caused by the parasitic capacitance by no more than 30 percent, or by no more than 20 percent). Accordingly, alternative concepts for the reduction of common mode distortions, which are often space-consuming or have a negative impact on losses and efficiency, are no longer required.

The corresponding transformer arrangement is based on the insight that in operation of the transformer, the magnetic flux change induces a voltage along a conductor (for example, a wire, which may, for example, be implemented using a copper trace on a PCB) of the compensating arrangement. The magnetic flux change is related to the voltage change of the primary winding (also designated as primary winding set). Therefore, the induced wire voltage (for example, the voltage induced in the compensation arrangement) does have an exact phase and amplitude relation to the input voltage change (or to the input voltage), which on the other hand is creating common mode noise by the inter-winding coupling. The wire induced voltage (for example, the voltage induced in the compensation arrangement) is fed as an AC current via the additional capacitor into the secondary ground side. In other words, an AC current caused by the wire induced voltage may be fed as the AC current via the additional capacitor into the secondary ground side.

If the polarity of the wire induced voltage (which may be determined by the path along which the wire extends, and which may for example depend on the decision whether the wire is routed in an upper or in a lower core half of a core of the transformer, or may for example be determined through a design, where the wire is wound clock-wise or anti-clockwise) and the cancellation capacitor are chosen right, the total common mode noise can be cancelled out (at least partially) by these means.

The advantageous thing about picking up the real core flux change (for example, by the compensation arrangement) is, that this is an exact copy of the primary voltage change, no matter at which load conditions the transformer is operating. For example, the voltage induced in the compensation arrangement may be an exact (possibly scaled) copy of the primary voltage. Therefore, the arrangement according to the present invention allows to compensate current induced by a parasitic capacitance using current coupled to the secondary winding via the coupling capacitor. It is therefore no longer necessary to minimize a parasitic capacitance between the primary winding and the secondary winding. Thus, the solution according to the present invention outperforms conventional solutions.

For example, in order to avoid capacitive coupling, it is stated in the art that the inter-winding capacitance is reduced during layout design phase. This can be achieved by increased spacing or reducing the cross section between primary and secondary windings. In general, this leads to less copper utilization within the available core volume. This increases the copper trace resistance which causes higher power loss (DCR) or requires bigger core sizes to achieve target power capabilities. The proposed invention does not require increased layer spacing in PCB transformers or special handling of primary to secondary cross section during layout. It allows to fully utilizing the available transformer core volume.

If common mode noise cannot be reduced by coil design, it is state of the art to add common mode filtering elements like common mode chokes with corresponding capacitors. This approach requires additional components which drive space and cost of circuitry. With the proposed invention, external filtering circuit can be avoided or reduced. It allows adjusting the real common mode noise behavior after first prototype manufacturing.

In summary, it should be noted that the invented transformer arrangement is able to reduce the common mode noise significantly, wherein the requirements for the decoupling between primary winding and secondary winding can be relaxed, and wherein the layout of the transformer arrangement can be smaller than already existing transformers with the same efficiency, whereby costs can be reduced.

In a preferred embodiment of the transformer arrangement, the windings are part of a planar transformer. This means that the coils of the windings are for example, in a planar layer or in multiple planar layers, and if the transformer is a multilayer transformer, it comprises more than one planar layer with a coil. Thus, the transformer arrangement can be very small. Moreover, since a parasitic capacitive coupling between the windings is typically comparatively large in a planar capacitor, the usage of the compensating arrangement is particularly advantageous in such a planar capacitor. Also, the compensating arrangement can, for example, be implemented with small effort in such a planar capacitor, for example using a trace on a planar layer as a conductor of the compensating arrangement.

In a preferred embodiment of the transformer arrangement, the primary winding and/or the secondary winding is center tapped. The center tap may, for example, be a contact made to a point halfway along a winding of a transformer. But the center tap may not necessarily be at the halfway point, but rather, could be closer to one end. The transformer arrangement can have, for example, a multilayer primary winding and/or a multilayer secondary winding. In this design, for example, half of the coils are connected to a first terminal of the winding and to center tap and the other half of the coils in the other layers are connected to the second terminal of the winding and to center tap. This has the advantage that a winding can be provided with only at least three terminals, which may be helpful to drive the primary winding of the transformer or derive an output voltage from the secondary winding of the transformer, Having a center tap may enable to design symmetric circuits. For example, the compensating arrangement can be circuited between the center tap of the primary winding and the center tap of the secondary winding and can therefore help to avoid dynamic potential shifts between the potentials at the center taps of the primary and secondary windings.

In a preferred embodiment of the transformer arrangement, the center tap is a reference potential node. Thus, for example, an input voltage may alternatingly be applied to the first terminal and to the second terminal of the primary winding which results in a change of the magnetic flux direction (for example, without having input voltages of different polarity with respect to the input-sided reference potential). Also, it should be noted that the primary-sided reference potential and the secondary-sided reference potential may be independent or floating with respect to each other. Accordingly, the compensating arrangement may, for example, help to reduce dynamic shifts between the primary-sided reference potential and the secondary-sided reference potential by providing a current that counteracts the current caused by the parasitic capacitive coupling.

In a preferred embodiment of the transformer arrangement, the primary winding and the secondary winding have at least one coil with at least one turn. The winding of the primary winding or the secondary winding can, for example, have more than one layer. In such a design, the winding has for example, in each layer one coil and each coil can have at least one turn (which means for example, one curve of 360°, one spiral of 360° or one rectangular wiring).

In a preferred embodiment of the transformer arrangement, the primary winding and the secondary winding comprise a plurality of coils which are arranged in different layers of a multilayer structure, wherein the different coils forming a winding extend around a magnetic flux conductor. The multilayer structure can for example, comprise a printed circuit board (PCB). The PCB acts in this case, for example, as insulating material or as substrate for the coils of the windings. According to this embodiment, the coils of the winding (for example, the primary winding and/or the secondary winding) can be arranged above each other, which results in a smaller transformer arrangement which can reduce the costs. Moreover, a conductor of the compensating arrangement may, for example, also be arranged on the PCB structure and may, for example, at least partially extend around the magnetic flux conductor. Accordingly, the primary winding and the secondary winding and the compensation arrangement can be integrated in a cost-efficient manner on the PCB, with the magnetic flux conductor (for example, a magnetic core) concentrating the magnetic flux (wherein the compensating arrangement is designed such that the magnetic flux concentrated in the flux conductor induces a voltage within the compensating arrangement).

In a preferred embodiment of the transformer arrangement, the primary winding and the secondary winding are coupled using an E-core which is configured to guide the magnetic flux. According to this layout, for example, the primary winding and/or the secondary winding can be arranged around the center leg of the E-core. Thus, the magnetic flux induced by the primary winding flows through the secondary winding and can induce there a voltage. This induced voltage results in a current flow through the secondary winding. The E-core can, for example, be a ferrite core. Also, the compensating arrangement can be arranged such that a voltage of an appropriate phase or polarity is induced in the compensating arrangement. In the case that an E-core is used, a wire of the compensating arrangement may, for example, be arranged through at least one of the gaps of the E-core, wherein an actual position of the wire may determine a polarity and a magnitude of the induced voltage. Thus, the size of the transformer arrangement can be used efficiently, and a strong coupling magnetic coupling between the primary winding and the compensating arrangement can be achieved by using the E-core, which helps to obtain a proper phase of the induced voltage.

In a preferred embodiment according to the invention, the link provided by the compensating arrangement is a DC blocking AC link (DC is understood as direct current and AC is understood as alternating current) between a terminal of the primary winding and a terminal of the secondary winding of the transformer arrangement. As the compensating arrangement is located in the magnetic flux, an alternating current can be induced in the compensating arrangement (in response to the induced voltage) which can flow over the DC blocking AC link from a terminal of the primary winding to a terminal of the secondary winding. The terminal of the primary winding and/or the terminal of the secondary winding can be the center tap. Accordingly, this alternating current induced in the compensating arrangement can counteract a parasitic current caused by the capacitive coupling between the primary winding and the secondary winding and can counteract a shift of the potential of the secondary winding which would normally be caused by the parasitic capacitance ("common mode distortion"). On the other hand, by blocking DC current, the secondary winding can "float" with respect to the primary winding, such that a circuit connected to the secondary winding is not bond to a fixed potential determined by the primary side of the transformer arrangement.

In a preferred embodiment according to this invention, the compensating arrangement of the transformer arrangement comprises a wire in series with a capacitor. A primitive example of the compensating arrangement is a wire in series with a capacitor. According to this embodiment, the capacitor blocks a direct current and transfers (passes) an alternating current, wherein the alternating current can at least partially compensate a parasitic current that is caused by an inter-winding capacitance between the primary winding and the secondary winding of the transformer arrangement. A wire can be implemented at very low cost, and can be arranged flexibly to adjust the voltage induced in the wire.

In an embodiment according to the present invention, a wire of the compensating arrangement of a transformer arrangement comprises at least half a winding, which is positioned completely in a projection of a coil of the primary winding perpendicular (in a direction of an axis of the primary winding) to a plane in which the coil is arranged. The direction of the axis of the primary winding can also be the direction of a central magnetic flux, With this design, the same magnetic flux may flow through all coils of the primary winding and the secondary winding of the transformer arrangement. With this structure, there is also no shift between the layers necessary. Thus, a greater efficiency is achieved, because the whole surface of the transformer coils is in use. Furthermore, the structure is space-efficient.

For example, the invention is compensating the common mode current that is created by the inter-winding layout capacitance. This is achieved by a dedicated wire routing through one half of the transformer core in combination with a coupling capacitor. This wire in series with a coupling capacitor creates an AC link between primary DC terminals and secondary DC terminals.

In an embodiment according to this invention, a wire of the compensating arrangement of the transformer arrangement is wrapped such that the change of the magnetic flux through the primary winding and the secondary winding induces a voltage between ends of the wire. The current resulting from this voltage can at least partially compensate common mode noise.

In a preferred embodiment according to this invention, the wire of the compensating arrangement of the transformer arrangement is arranged such to at least partially enclose a magnetic core around which the primary winding and the secondary winding are arranged. According to this embodiment, the magnetic flux within the magnetic core induces a voltage along the wire which is arranged around the magnetic core. The current resulting from the induced voltage is, for example, able to compensate the parasitic current. Also, the transformer-arrangement is very space-efficient, and there is a good coupling between the magnetic flux and the wire of the compensating circuit.

In a preferred embodiment according to this invention, the direction of the winding of the wire of the compensating arrangement of the transformer arrangement is configured such that the polarity of the current, caused by the induced voltage in the compensating arrangement, is opposed to the polarity of the current that is caused by an inter-winding capacitance between the primary winding and the secondary winding. For example, the winding of the wire of the compensating arrangement can be clockwise or counterclockwise, whereby two different polarities can be achieved. The polarity defines if the current resulting because of the induced voltage flows from the primary winding to the secondary winding or from the secondary winding to the primary winding. By an appropriate design, a good compensation effect can be achieved.

In a preferred embodiment according to this invention, the capacitor of the compensating arrangement of the transformer arrangement has a capacitance, which is chosen such that a current, which is caused by the voltage induced in the compensating arrangement and fed to the secondary winding, comprises a magnitude which is at least 50% of a magnitude of the current that is caused by the inter-winding capacitor. Because of the current fed to the secondary winding by the compensating arrangement, the common mode noise can be at least partially repressed. The current caused by the voltage induced in the compensating arrangement is opposed to the current that is caused by the inter-winding capacitor. Hence, the parasitic current which is also known as common mode noise can at least partially be compensated.

In a preferred embodiment according to this invention, one side of the compensating arrangement of the transformer arrangement is coupled to a reference node of the primary winding and another side of the compensating arrangement is coupled to a reference node of the secondary winding. Thus, the compensating arrangement forms a link between the primary winding and the secondary winding. The reference node can, for example, be the ground.

In a preferred embodiment according to this invention, the capacitor of the compensating arrangement of the transformer arrangement is for example positioned such that the distance between the capacitor and the reference node of the secondary winding is smaller than the distance between the capacitor and reference node of the primary winding. Accordingly, a decoupling of the secondary side can be improved.

Another embodiment according to this invention is a circuit arrangement, comprising a primary winding, which is part of a primary circuit, and a secondary winding, which is part of a secondary circuit. The primary winding and the secondary winding are magnetically coupled. The circuit arrangement also comprises a compensating arrangement. The compensating arrangement is circuited (which can also be understood as arranged or configured) to provide an AC link between a reference potential node of the primary circuit and a reference potential node of the secondary circuit (the link is electrically and the primary winding can also be understood as primary DC terminal and a secondary winding can also be understood as secondary DC terminal). The compensating arrangement is configured such that a change of a magnetic flux through the primary winding and the secondary winding induces a voltage in the compensating arrangement (for example, along the wire). The compensating arrangement also comprises at least one coupling capacitor configured to block a DC current (between the primary winding and the secondary winding) and to pass a current (AC current) caused by the induced voltage (for example, a current flowing towards the reference potential node of the secondary circuit). The compensating arrangement is configured to at least partially compensate a (parasitic) current that is caused by an inter-winding capacitance between the primary winding and the secondary winding (using the current caused by the induced voltage). The primary winding can also be understood as primary circuit and the secondary winding can also be understood as secondary circuit. This circuit provides a good suppression of common mode distortions, since the voltage induced in the compensating arrangement causes a compensating current which is out-of-phase with a current caused by a parasitic capacitance.

Another embodiment according to this invention creates a method for operating a transformer arrangement. The method comprises a magnetic coupling of a primary winding and a secondary winding of the operating transformer arrangement. The method also comprises a step where a compensating arrangement provides a link between a terminal of the primary winding and a terminal of the secondary winding. In a next step, a change of a magnetic flux through the primary winding and the secondary winding induces a voltage in the compensating arrangement. The compensating arrangement comprises at least one coupling capacitor, which blocks a DC current and passes a current caused by the induced voltage. The method comprises another step wherein the compensating arrangement partially compensates a current that is caused by an inter-winding capacitance between the primary winding and a secondary winding.

The method is based on the same considerations as the above described transformer arrangement and/or circuit arrangement.

The method can, by the way, be completed with all features and functionalities, which are also described with regard to the transformer arrangement and/or the circuit arrangement.

BRIEF DESCRIPTION OF THE DRAWINGS

The drawings are not necessarily to scale, emphasis instead generally being placed upon illustrating the principles of the invention. In the following description, various embodiments of the invention are described with reference to the following drawings, in which.

DETAILED DESCRIPTION OF THE EMBODIMENTS

Figure 1:
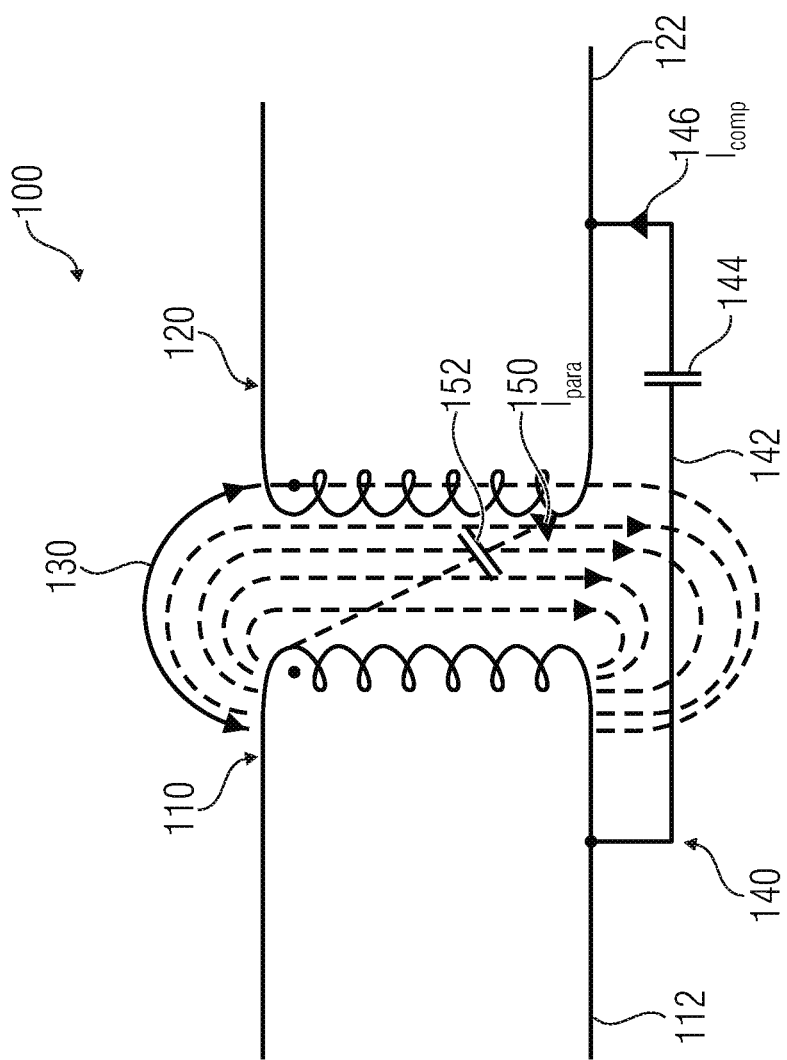
FIG. 1 shows a high-level schematic view of a transformer arrangement according to an embodiment of the present invention.

1) Transformer Arrangement According to FIG. 1

FIG. 1 shows a high-level schematic view of a transformer arrangement 100 according to an embodiment of the present invention.

The transformer arrangement 100 comprises preferably (optional) a primary winding 110 and a secondary winding 120. The primary winding 110 and the secondary winding 120 are, for example, magnetically coupled (for example using a common magnetic flux 130). The transformer arrangement 100 also comprises a compensating arrangement 140, which is arranged to provide a link (for example, an AC link, or a DC blocking AC link) between a terminal 112 of the primary winding 110 and a terminal 122 of the secondary winding 120. Between the terminal of the primary winding 112, which can also be called primary DC terminal (DC means direct current), and the terminal of the secondary winding 122, which can also be called the secondary DC terminal (DC means direct current), there is an electrical link (AC link), which is provided by the compensating arrangement 140. The compensating arrangement 140 is configured such that a change of a magnetic flux 130 through the primary winding 110 and the secondary winding 120 induce a voltage in the compensating arrangement 140 (for example along the wire 142). The compensating arrangement 140 of the transformer arrangement 100 comprises for example, at least one, for example series connected coupling capacitor 144 configured to block a DC current between the terminal 112 of the primary winding 110 and the terminal 122 of the secondary winding 120, or along the link, and to pass a current 146 caused by the induced voltage (for example, a compensating current 146 flowing towards the terminal 122 of the secondary winding). The compensating arrangement 140 is configured to at least partially compensate a parasitic current 150 that is caused by an inter-winding capacitance 152 between the primary winding 110 and the secondary winding 120 using the current 146 caused by the induced voltage.

Thus, one can see that the transformer arrangement 100 with the compensating arrangement 140 can be more efficient in a transfer of energy between the primary winding 110 and the secondary winding 120 when the parasitic current 150 can be compensated (for example, because other inefficient means for reducing common mode distortions become unnecessary). According to this embodiment, the compensating arrangement 140 can be very small in comparison with a conventionally used external filter which may also compensate the parasitic current 150. The transformer arrangement 100 can also be more exact than the state of the art, in repressing parasitic current 150 with the induced current 146, because the current 146 which may compensate the parasitic current 150 can be adjusted precisely by a proper design.

The transformer arrangement 100 is thus very efficient in the coupling between the primary winding 110 and the secondary winding 120. The transformer arrangement 100 is also able to reduce costs because the compensating arrangement 140 can be configured very small. The transformer arrangement 100 can optionally be complimented with all herein described features and functionalities individually or in combination.

Figure 2:
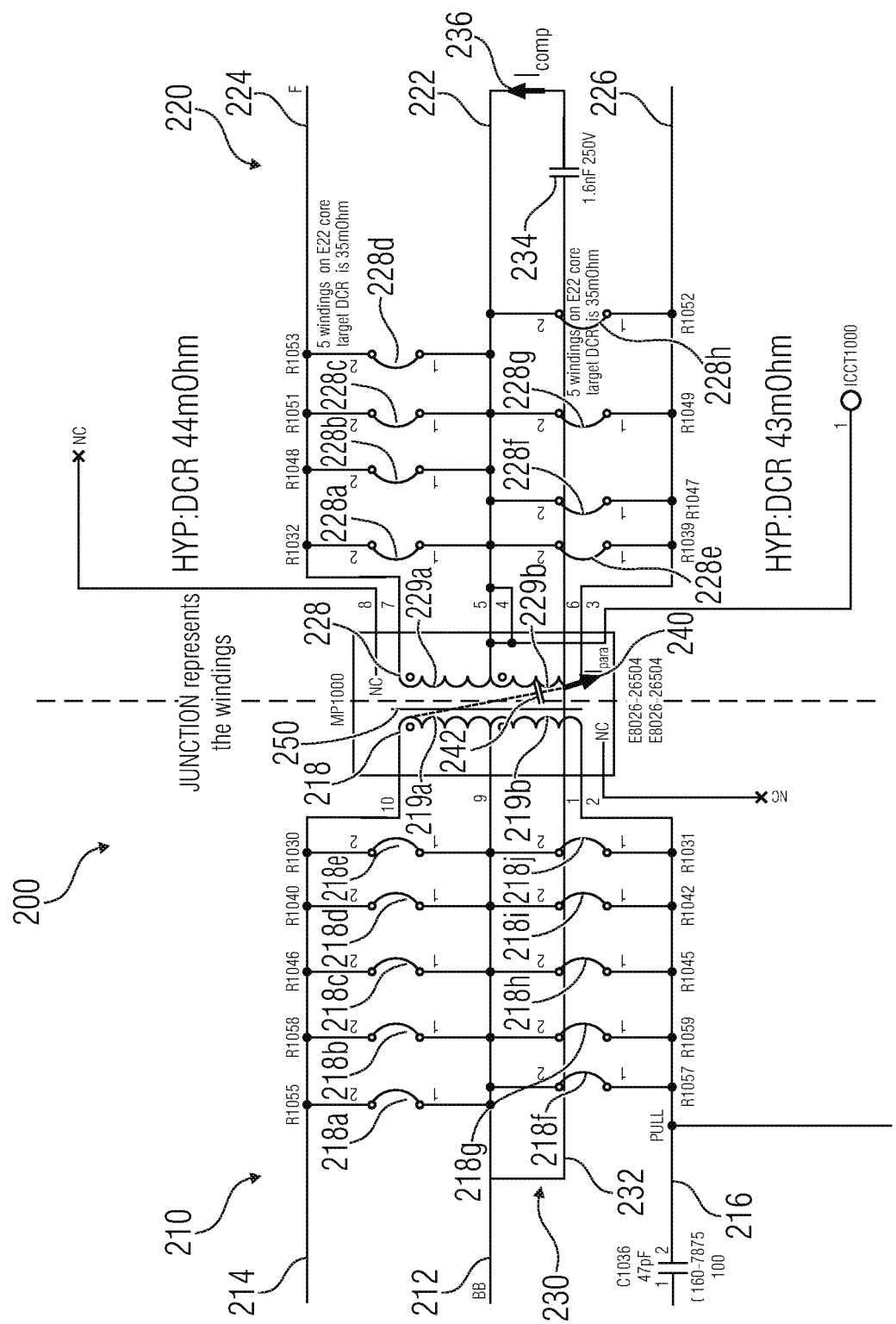
FIG. 2 shows a low-level schematic view of the transformer arrangement of FIG. 1 according to an embodiment of the present invention.

2) Transformer Arrangement According to FIG. 2

FIG. 2 shows a low-level schematic view of the transformer arrangement 200 of FIG. 1 (the transformer arrangement is labeled as element 100 in FIG. 1) according to an embodiment of the present invention.

The transformer arrangement 200 comprises a primary winding 210 and a secondary winding 220 which are magnetically coupled. The transformer arrangement 200 also comprises a compensating arrangement 230, which is configured to provide a link (an AC link or a DC blocking AC link) between a terminal 212 of the primary winding and a terminal 222 of the secondary winding. In the transformer arrangement 200, the terminal of the primary winding 212 is, for example, a center tap and the terminal of the secondary winding 222 is also, for example, a center tap. According to this embodiment, the center taps 212 and 222 are reference potential nodes of the primary side and of the secondary side, respectively. The reference potential node of the primary side can, for example, be considered as the ground. According to this embodiment, the primary winding 210 comprises a first terminal 214 and a second terminal 216 and the secondary winding 220 of the transformer arrangement 200 comprises a first terminal 224 and a second 226. The transformer arrangement 200 can, for example, be part of a DC to DC converter. In this case, the first terminal 214 can be a push terminal and the second terminal 216 can be a pull terminal. According to this embodiment, the transformer arrangement 200 has a primary winding 210 which can, for example, be part of a symmetrical push pull circuit. The first terminal 214 and the second terminal 216 of the primary winding 210 are alternatingly switched on and off (coupled to a supply voltage), periodically reversing the current in the primary winding of the transformer. The primary winding 210 and the secondary winding 220 of the transformer arrangement 200 have, for example, at least one coil 218 and 228 with at least one turn (a turn can, for example, be in this case, a 360° spiral or a 360° curve, or a rectangular wiring). The transformer arrangement 200 according to this embodiment, can, for example, be a multilayer planar transformer. In this case, the primary winding 210 and the secondary winding 220, for example, each comprise a plurality of coils 218a to 218j and 228a to 228h which are arranged in different layers of a multilayer structure (PCB), wherein the different coils 218a to 218j and 228a to 228h forming a winding extended around a magnetic flux conductor. In other words, the first part of the primary winding 210 symbolically shown at reference numeral 219a is, for example, actually implemented by a parallel circuit of coils 218a-218e, and a second part of the primary winding 210 symbolically shown at reference numeral 219b is actually implemented by a parallel circuit of coils 218f to 218j and the first part of the secondary winding 220 symbolically shown at reference numeral 229a is actually implemented by a parallel circuit of coils 228a-228d, and a second part of the secondary winding 220 symbolically shown at reference numeral 229b is actually implemented by a parallel circuit of coils 228e to 228h. It is also, for example, possible that less or more coils per winding can be implemented in a parallel circuit than shown in this figure.

The transformer arrangement 200 also comprises, according to this embodiment of the present invention, a compensating arrangement 230 which is configured such that a change of a magnetic flux through the primary winding 210 and the secondary winding 220 induces a voltage in the compensating arrangement 230 (for example, along the wire 232). The compensating arrangement comprises, for example, at least one (series connected) coupling capacitor 234 configured to block a DC current (DC current means direct current) between the terminal of the primary winding 212 and the terminal of the secondary winding 222, or along the link 230 and to pass a current 236 caused by the induced voltage (for example, a compensating current 236 going towards the terminal of the secondary winding 222). The compensating arrangement 230 of the transformer arrangement 200 is, for example, configured to at least partially compensate a parasitic current 240 that is caused by an inter-winding capacitance 242 between the primary winding 210 and the secondary winding 220 using the current 236 caused by the induced voltage. The current 236 ($I_{amp}$) can also be called the compensating current. The compensating arrangement 230 is (or comprises), for example, a wire 232 in series with a capacitor 234. The primary winding 210 and the secondary winding 220 can for example be coupled by a magnetic core 250. Such a core 250 can for example be an e-core, where the primary winding 210 and the secondary winding 220 are wound around the center leg.

In the following, the operation of the transformer arrangement 200 will be described. Between the primary winding 210 and the secondary winding 220 can, for example, arise a parasitic inter-winding capacitance 242. This inter-winding capacitance 242 combines, for example, all possible parasitic inter-winding capacitances between single coils 218a to 218j of the primary winding 210 and single coils 228a to 228h of the secondary winding 220. Because of the inter-winding capacitance 242, a parasitic (AC) current 240 flows between the primary winding 210 and the secondary winding 220. The parasitic current 240 is also understood, for example, as common mode noise and can lead to an unwanted shift of the potential of the secondary winding. This unwanted potential shift can, for example, at least partially be repressed by the compensating arrangement 230.

The coupling capacitor 234 can, for example, be chosen such, that the compensation current 236 (which is caused by the induced voltage in the wire of the compensating arrangement 230) arising in the compensating arrangement has a value of at least 50% of the parasitic current 240 and a polarity, which is opposed to the polarity of the parasitic current 240. This compensating current 236 can, for example, repress the parasitic current 240 and improve therefor the efficiency of the transformer arrangement. On the other hand, by blocking DC current with the coupling capacitor 234, the secondary winding can "float" with respect to the primary winding, such that a circuit connected to the secondary winding is not bond to a fixed potential determined by the primary side of the transformer arrangement.

The transformer arrangement 200 can optionally be complimented by all herein described features and functionalities individually or in combination.

Figure 3:
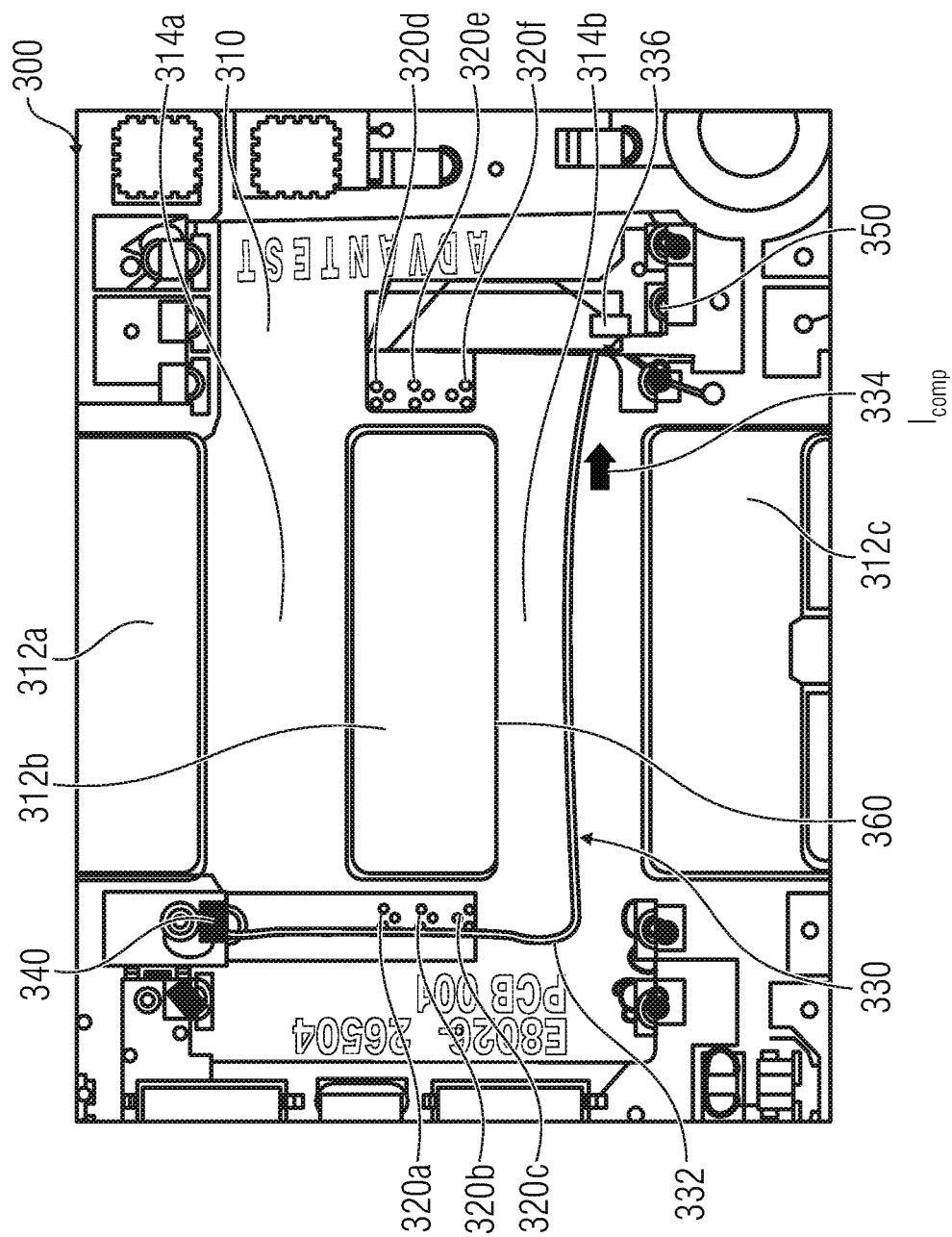
FIG. 3 shows a detailed product-level view of the transformer arrangement of FIG. 2 according to an embodiment of the present invention, where an E-core is not shown.

3) Transformer Arrangement According to FIG. 3

FIG. 3 shows a detailed product-level view of the transformer arrangement 300 of FIG. 2 (the transformer arrangement is labeled as element 200 in FIG. 2) according to an embodiment of the present invention, where an E-core is not shown. The transformer arrangement 300 comprises, for example, a primary winding a secondary winding. The coils of the primary winding and the secondary winding are arranged on a PCB printed circuit board. In FIG. 3, one can only see the top surface 310 of a multilayer planar transformer, which is an example of the present invention and shows the surface of an insulating layer. The coils of the primary winding have interlayer connections (vias) 320a to 320c and the coils of the secondary winding have interlayer connections (vias) 320d to 320f. Interlayer connections 320a to 320f are, for example, plated through-holes. On the top surface 310, for example, the compensating arrangement 330 is arranged. The compensating arrangement 330 is circuited to provide a link (an AC link, or a DC blocking AC link) between a terminal 340 of the primary winding and a terminal 350 of the secondary winding. The compensating arrangement is configured such that, for example, a change of a magnetic flux through the primary winding and the secondary winding of the transformer arrangement 300 induces a voltage in the compensating arrangement 330 (for example, along a wire 332). The wire 332 of the compensating arrangement 330 comprises, for example, at least half a winding, which is positioned completely (or at least partially) in a projection perpendicular to the direction of extension (x1, y1) of the primary winding of the transformer arrangement 300. In other words, the wire 332 of the compensating arrangement 330 comprises, for example, at least half a winding, which is positioned completely (or at least partially) in a projection of a coil of the primary winding perpendicular (in a direction of an axis) to the primary winding (to a plane in which the coil is arranged). The wire 332 is, for example, wrapped such that the change of the magnetic flux through the primary winding and the secondary winding of the transformer arrangement 300 induces a voltage between ends of the wire 332. The wire 332 can also, for example, be arranged such to at least partially enclose a magnetic core 360 around which the primary winding and a secondary winding are arranged. The direction of the winding of the wire 332 of the compensating arrangement 330 is, for example, configured such that the polarity of the current 334, caused by the induced voltage in the compensating arrangement 330, is opposed to the polarity of the current that is caused by an inter-winding capacitance between the primary winding and the secondary winding. The polarity can for example be changed with the direction of the half winding of the wire. In FIG. 3 the wire 332 is for example arranged counterclockwise (the wire 332 lies in the bottom half of the transformer core). A different polarity can for example be achieved, when the half winding of the wire is arranged clockwise (the wire 332 lies in the top half of the transformer core). The compensating arrangement 330 is, for example, a wire 332 in series with a capacitor 336. The capacitor 336 of the compensating arrangement 330 has, for example a capacitance, which is chosen such that a current 334, which is caused by the voltage induced in the compensating arrangement 330 and fed to the secondary winding, comprises a magnitude which is at least 50% of a magnitude of the current that is caused by inter-winding capacitor. One side of the compensating arrangement 330 is, for example, coupled to a reference node 340 of the primary winding and another side of the compensating arrangement 330 is coupled to a reference node 350 of the secondary winding. The capacitor 336 of the compensating arrangement 330 is, for example, positioned such that the distance between the capacitor 336 at the reference node 350 of the secondary winding is smaller than the distance between capacitor 336 and the reference node 340 of the primary winding.

In the following, an example geometry will be described. It is assumed here that the planar transformer (of the transformer arrangement 300), for example, uses an E core. Accordingly, the printed circuit board comprises, for example, three rectangular cutouts 312a, 312b and 312c for the legs of the E-core, which are arranged one beside the other, with portions 314a and 314b of the printed circuit board in between. A first portion 314a of the printed circuit board which is between a first leg (first cutout 312a) of the E-core and a second leg (center leg, second cutout 312b) of the E-core extends from a primary side (or, generally, a first side) of the printed circuit board (when seen from the point of view of the transformer) to a secondary side (or, generally a second side) of the printed circuit board (when seen from the point of view of the transformer). Similarly, a second portion 314b of the printed circuit board which is between the second leg (center leg, second cutout 312b) of the E-core and a third leg (third cutout 312c) of the E-core extends from the primary side of the printed circuit board to the secondary side of the printed circuit board.

Terminals (for example the terminal 340) of the primary winding are arranged on the primary side of the printed circuit board. Terminals (for example the terminal 350) of the secondary winding are arranged on the secondary side of the printed circuit board.

The wire 332 extends from a terminal 340 of the primary winding which is arranged on the primary side of the printed circuit board next to the first leg (or next to the cutout 312a for the first leg) towards a terminal 350 of the secondary winding which is arranged on the secondary side of the printed circuit board next to the third leg (or next to the cutout 312c for the third leg). The wire 332 extends on the primary side of the printed circuit board from the terminal 340 of the primary winding towards a bending point which on the primary side of the pcb next to the second portion 314b of the pcb. After the bending point, the wire 332 extends towards the secondary side of the printed circuit board via the second portion 314b of the pcb. At the secondary side of the pcb, the wire 332 is coupled to the terminal 350 of the secondary winding via a chip capacitor 336. Thus, the wire 332 comprises, at least approximately, an L-shape and therefore corresponds, at least approximately, to half of a rectangular winding.

The wire 332 may be implemented using a dedicated (preferably insulated) wire, or, alternatively; using a wire trace structured on the pcb.

The windings or coils are, for example, arranged around the central cutout 312b (which is for the central leg of the E-core), preferably on the inner layers of the multi-layer pcb.

The transformer arrangement 300 can optionally be complimented by all herein described features and functionalities individually or in combination.

Optionally, the coupling capacitor 336 could be arranged on the primary side of the pcb or even on the first portion 314a of the pcb or on the second portion 314b of the pcb.

Also, the wire 332 could optionally be wound around the central cutout 312b (cutoff) one time or multiple times, which would increase the voltage induced in the wire 332.

Further, the wire 332 could also be routed along the first portion 314a, which would change a sign of the voltage induced in the wire 332.

Naturally, another type of core could also be used.

Figure 4:
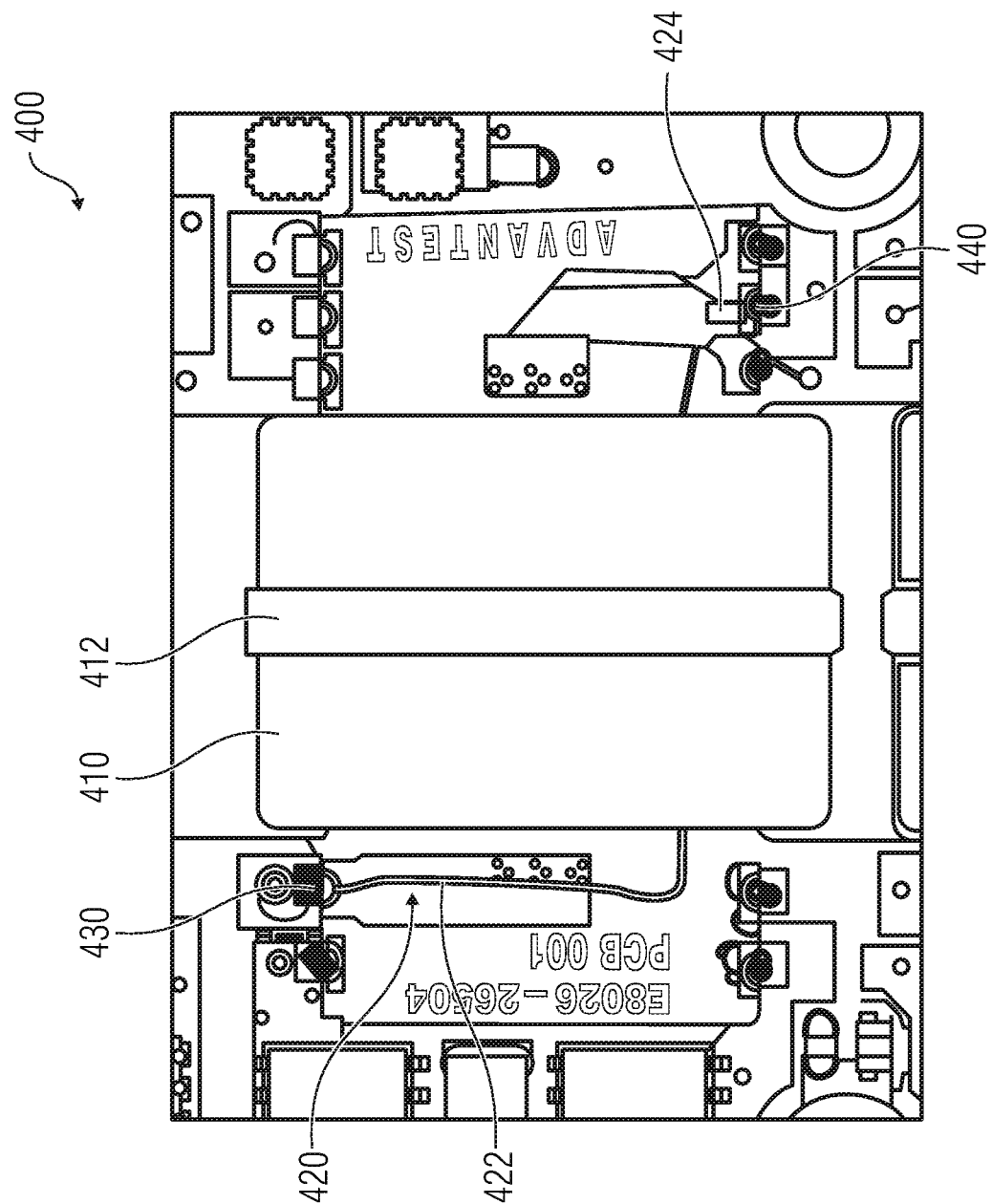
FIG. 4 shows a detailed product-level view of the transformer arrangement of FIG. 3 according to an embodiment of the present invention, where an E-core is shown.

4) Transformer Arrangement According to FIG. 4

FIG. 4 shows a detailed product-level view of the transformer arrangement 400 of FIG. 3 (the transformer arrangement is labeled as element 300 in FIG. 3) according to an embodiment of the present invention with an E-core 410 which is configured to guide the magnetic flux.

The transformer arrangement 400 represents the transformer arrangement 300 of FIG. 3 with an E-core implemented in the cutoffs, described in FIG. 3.

The E-core 410 is attached to the planar multilayer transformer with a fastener 412. The E-core 410 increases a coupling between the primary winding and the secondary winding of the transformer arrangement 400. The primary winding and the secondary winding of the transformer arrangement 400 are arranged around a center leg of the E-core 410 and, for example, are formed by coils arranged on a PCB (printed circuit board). The transformer arrangement 400 also comprises a compensating arrangement 420 which comprises, for example, a wire 422 which extends at least through a spacing (or gap) between the center leg of the E-core 410 and one of the other legs. The compensating arrangement 420 makes a connection 430 to the primary winding and a connection 440 to the secondary winding. These connections 430 and 440 are, for example, arranged next to opposing sides of the E-core 410 (for example, on the primary side or first side of the pcb and on the secondary side or second side of the pcb). The compensating arrangement 420 of the transformer arrangement 400 comprises, for example, a single wire trace 422 on PCB (non-wound) and at least one capacitor 424.

The transformer arrangement 400 can, optionally, be complimented with all herein described features and functionalities individually or in combination.

Figure 5:
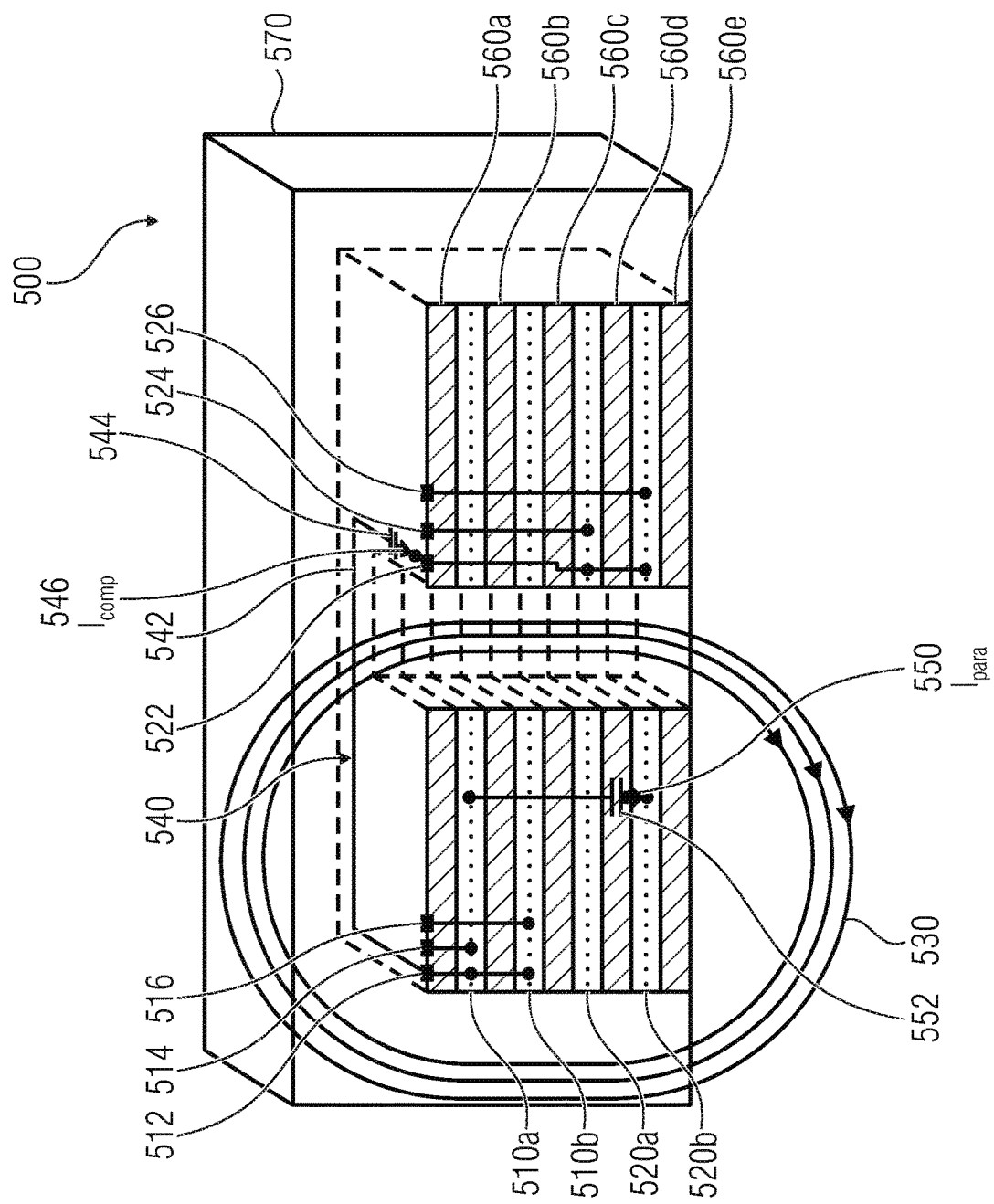
FIG. 5 shows a detailed product-level view of a cross-section of the transformer arrangement of FIG. 4 according to an embodiment of the present invention.

5) Transformer Arrangement According to FIG. 5

FIG. 5 shows a detailed product-level view (perspective view) of a cross-section of the transformer arrangement 500 of FIG. 4 (the transformer arrangement is labeled as element 400 in FIG. 4) according to an embodiment of the present invention. The transformer arrangement 500 comprises, for example, a primary winding 510a and 510b and a secondary winding 520a and 520b which are magnetically coupled 530. The transformer arrangement 500 is, for example, a planar multilayer transformer with isolating layers 560a to 560e, which are arranged between conductive layers 510a, 510b, 520a and 520b of the pcb (The conductive PCB-layers 510a, 510b, 520a and 520b (each) comprise a coil with at least one turn). The primary winding 510a and 510b has a center tap 512 and the secondary winding 520a and 520b has, for example, a center tap 522. The center taps 512 and 522 can, for example, be primary-sided and secondary-sided reference potential nodes. The primary winding 510a and 510b also has a first terminal 514 of the primary winding and a second terminal 516 of the primary winding. The secondary winding 520a and 520b also has, for example, a first terminal of the secondary winding 524 and a second terminal of the secondary winding 526. The transformer arrangement 500 according to this embodiment also comprises a compensating arrangement 540 which is arranged to provide a link between a terminal of the primary winding 512 and a terminal of the secondary winding 522. The compensating arrangement 540 is, for example, configured such that a change of a magnetic flux 530 through the primary winding and the secondary winding induces a voltage in the compensating arrangement 540 (for example, along the wire 542). The compensating arrangement 540 also comprises, for example at least one (series connected) coupling capacitor 544 configured to block a DC current between the terminal of the primary winding 512 and the terminal of the secondary winding 522 and to pass a current 546 caused by the induced voltage (for example, a compensating current 546 flowing towards the terminal of the secondary winding 522). The compensating arrangement can, for example, also be configured to at least partially compensate a parasitic current 550 that is caused by inter-winding capacitance 552 between the primary winding 510a and 510b and the secondary winding 520a and 520b using the current 546 caused by the induced voltage. The primary winding 510a and 510b and the secondary winding 520a and 520b are for example coupled by a magnetic E-core 570 and wound around the center-leg of the E-core. The E-core can for example be a ferrite core.

The transformer arrangement 500 can optionally be complimented with all herein described features and functionalities individually or in combination.

Figure 6A:
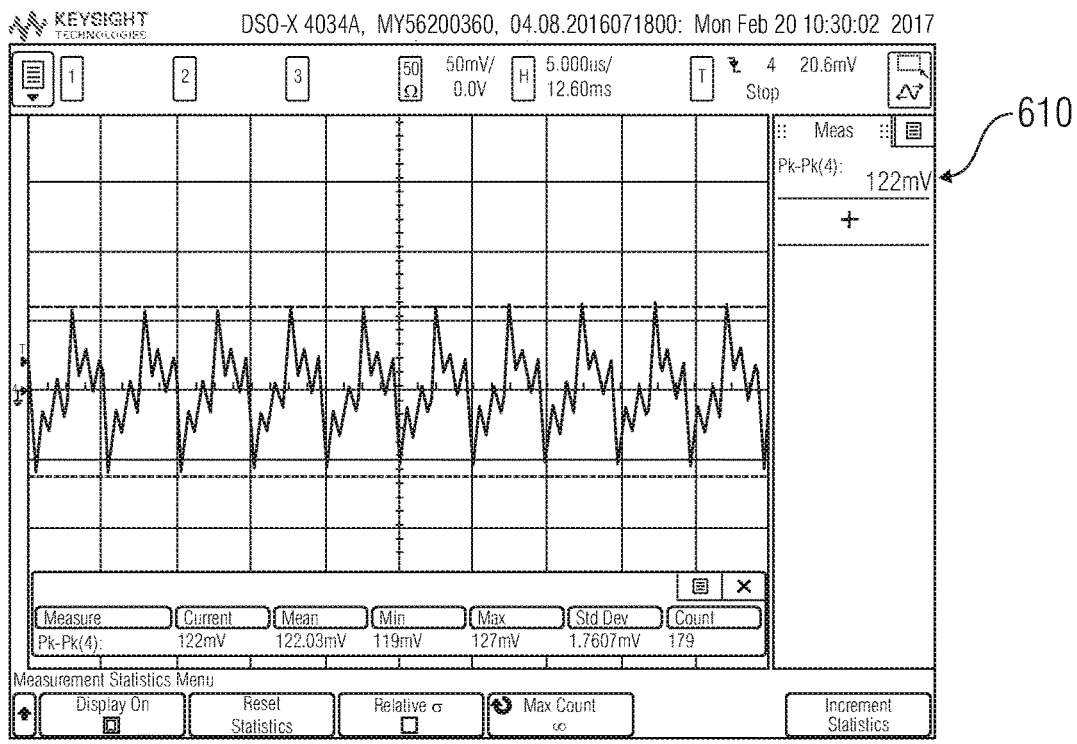
FIG. 6a shows a diagram with a time-voltage relationship for a conventional transformer arrangement without a compensating arrangement.
Figure 6B:
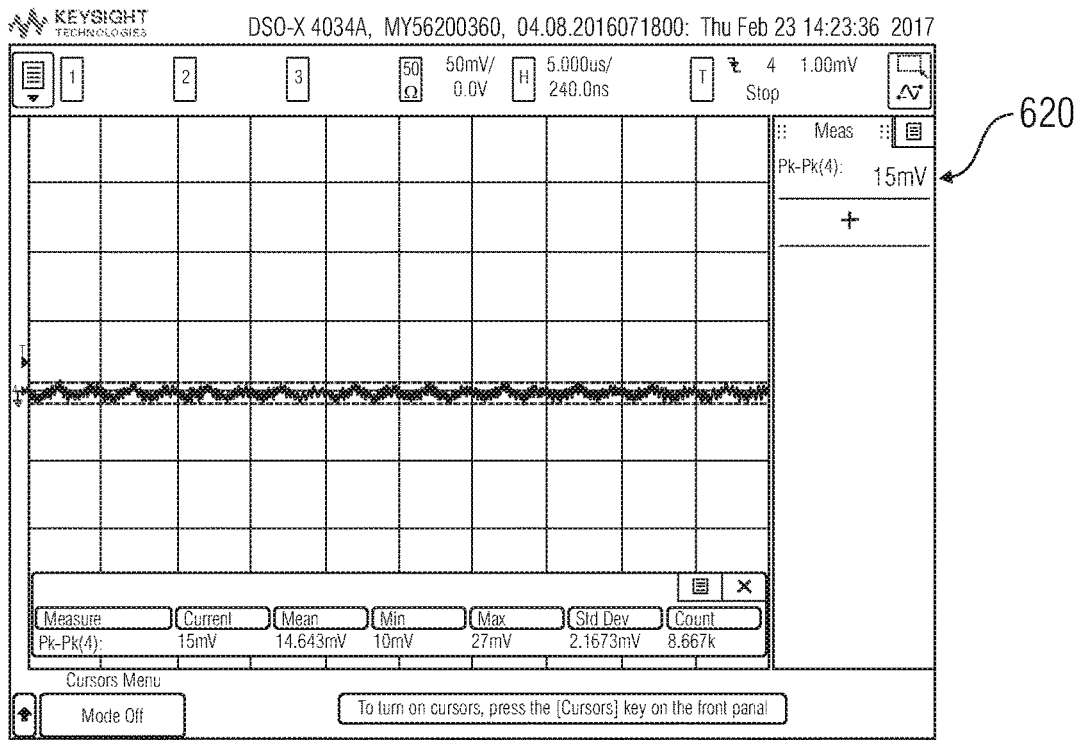
FIG. 6b shows a diagram with a time-voltage relationship for the transformer arrangement of FIG. 1, 2, 3, 4, or 5 with a compensating arrangement according to an embodiment of the present invention.

6) Common Mode Noise According to FIGS. 6a and 6b

FIG. 6a shows a diagram with a time-voltage relationship for a conventional transformer arrangement without a compensating arrangement. FIG. 6b shows a diagram with a time-voltage relationship for the transformer arrangement of FIG. 1, 2, 3, 4, or 5 with a compensating arrangement according to an embodiment of the present invention.

FIGS. 6a and 6b show a common mode noise signal of similar transformer arrangements. Both FIGS. 6a and 6b show on the abscissa the time and on the ordinate a voltage in mV (the ordinate is, for example, the potential difference between the reference potential of the primary side and the reference potential of the secondary side over a 50 Ohm resistance). In FIG. 6a, the common mode noise signal is recorded without a compensating arrangement and in FIG. 6b the common mode noise is recorded with a compensating arrangement. The compensating arrangement can also be called cancellation circuit. In FIG. 6a a mean voltage 610 of 122 mVpkpk (mV peak to peak) at a resistance of 50Ω (Ohm) could be measured. Out of this data, a parasitic current of 2.44 mApkpk (mA peak to peak) can be calculated. This parasitic current is also understood as common mode noise. In FIG. 6*b* a mean voltage 620 of 15 mVpkpk is recorded at a resistance of 50Ω. With this data, a parasitic current of 0.30 mApkpk can be calculated. This calculated data shows that the (effective) common mode noise decreases with a compensating arrangement. This means an improvement because of a compensating arrangement by a factor of 8.

Accordingly, it can be seen that the transformer arrangement according to the present invention clearly outperforms conventional solutions.

Figure 7:
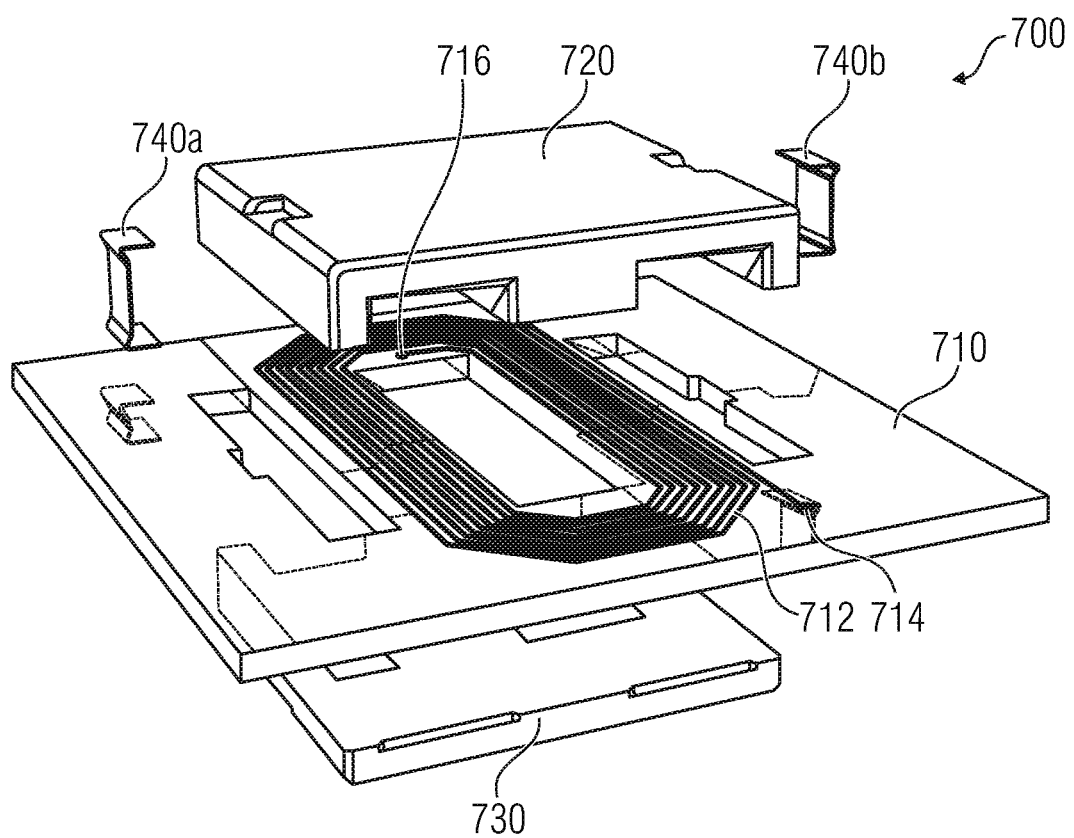
FIG. 7 shows a schematic view of a conventional planar transformer.

7) Planar Transformer According to FIG. 7

FIG. 7 shows a schematic view of a conventional planar transformer as shown in Wikipedia. The planar transformer consists of a PCB (printable circuit board) 710. On the PCB is a winding 712 with a first terminal 714 and a second terminal 716. It is also shown an E-core 720 and an I-core 730 and two clamps 740*a* and 740*b*.

Such an arrangement can be used in embodiments according to the present invention, supplemented by the compensation arrangement as described herein.

Figure 8:
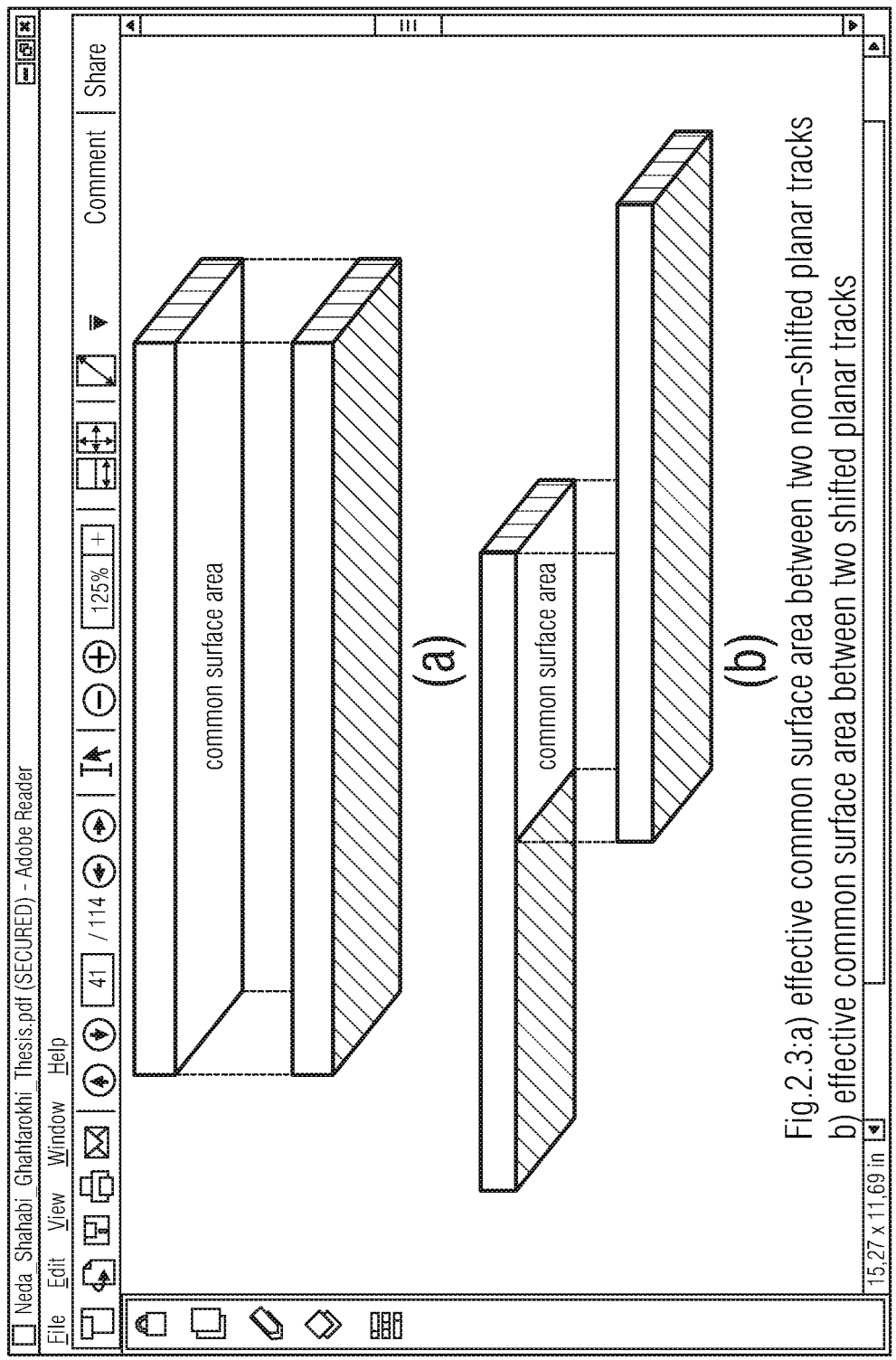
FIG. 8 shows a schematic view of a conventional decrease of an overlap by shifting traces.

8) Overlap by Planar Traces According to FIG. 8

FIG. 8 shows a concept to decrease an overlap by shifting traces as discussed in "Minimizing Capactive Couplings and Disributing Copper Losses in Planar Magnetic Elements" by Neda Shahabi Ghafarokhi (December, 2010). In FIG. 8*a* the effective common surface area between two non-shifted planar tracks can be seen. In FIG. 8*b* the effective common surface area between two shifted planar tracks can be seen.

Such a concept can be used in conventional approaches to reduce the parasitic capacitance, but the concept also increases area (costs) and/or increases losses. Even though the concept to shift adjacent planar tracks can be used in embodiments according to the present invention, it is not necessary, since the compensating arrangement helps to compensate a detrimental effect of the parasitic capacitance.

9. Conclusions

In the following some concepts according to the present invention will be described. It should be noted here, that the concepts described in this section can be used individually or taken in combination with features and functionalities described with respect to other embodiments and with features and functionalities described in the claims.

Also, features, functionalities and details described in this section can optionally be added to the embodiments described in the other sections or in the claims, both individually and in combination.

In the following, problems solved by embodiments of the invention will be described.

For example, embodiments of the invention do not require increased layer spacing in PCB transformers or special handling of primary to secondary cross section during layout. Embodiments allow to fully utilizing the available transformer core volume. External filtering circuit can be avoided or reduced. Embodiments allow adjusting the real common mode noise behavior after first prototype manufacturing.

In the following, a description of the construction and operation of embodiments according to the invention will be provided.

An embodiment compensates the common mode current that is created by the inter-winding layout capacitance. This is achieved by a dedicated wire routing through one half of the transformer core in combination with a coupling capacitor, for example as shown in FIG. 2, which represents a FVI LP1 common mode cancellation schematic.

This wire in series with a coupling capacitor creates an AC link between primary DC terminal and secondary DC terminal.

For example, FIG. 3 shows a Physical routing of the common mode cancellation wire, and FIG. 4 shows a Cancellation wire which is enclosed by ferrite core.

For example, during AC operation of the transformer, the magnetic flux change induces a voltage along the half winding. The magnetic flux change is related to the voltage change of the primary winding set. Therefore the induced wire voltage, for example, does have an exact phase and amplitude relation to the input voltage change, which on the other hand is creating common mode noise by the inter-winding coupling. The wire induced voltage is fed as an AC current via the additional capacitor into the secondary ground side. If the polarity (the wire in upper or lower core half) and cancellation capacitor is chosen right, the total common mode noise is cancelled out by this means.

The advantageous thing about picking up the real core flux change is, that this is an exact copy of the primary voltage change, no matter at which load conditions the transformer is operating.

As an example please see the FVI-16 implementation and results:

Initial common mode noise was 122 mVpkpk/50 Ohm=2.44 mApkpk

With wire and 1.6 nF about 15 mVpkpk/50 Ohm=0.30 mApkpk

This means an improvement by a factor of 8.

For example, FIG. 6*a* shows an FVI-16 example common mode noise without cancellation circuit, and FIG. 6*b* shows an FVI-16 example common mode noise with cancellation circuit.

To conclude, it can be seen that the transformer arrangement according to the present invention clearly outperforms conventional solutions.

The invention claimed is:

1. A transformer apparatus comprising:
a primary winding magnetically coupled with a secondary winding; and
a compensating circuit connected to a terminal of the primary winding and a terminal of the secondary winding to provide an AC-link;
wherein the compensating circuit comprises a wire portion, wherein a change of a magnetic flux through the primary winding and the secondary winding induces an AC voltage in the wire portion;
wherein further the compensating circuit comprises at least one coupling capacitor connected to the wire portion, wherein the at least one coupling capacitor is configured to block a direct current and is further configured to pass an AC current to the terminal of the secondary winding, wherein the AC current is caused by the induced AC voltage in the wire portion; and
wherein the compensating circuit is further configured to at least partially counteract a parasitic AC current with the AC current provided to the terminal of the secondary winding, wherein the parasitic AC current is caused by an inter-winding capacitance between the primary winding and the secondary winding, and wherein the AC current is out of phase relative to the parasitic AC current.

2. A transformer apparatus according to claim 1, wherein the primary winding and the secondary winding are part of a planar transformer.

3. A transformer apparatus according to claim 1, wherein one of the primary winding and the secondary winding comprises a center-tap.

4. A transformer apparatus according to claim 3, wherein the center-tap is a reference potential node.

5. A transformer apparatus according to claim 1, wherein the primary winding and the secondary winding each comprise at least one coil with at least one turn.

6. A transformer apparatus according to claim 5, wherein the primary winding and the secondary winding each comprise a plurality of coils arranged in different layers of a multi-layer structure, wherein a respective plurality of coils form a winding which extends around a magnetic flux conductor.

7. A transformer apparatus according to claim 1, wherein the primary winding and the secondary winding are coupled using an E-core and wherein the E-core is configured to guide the magnetic flux.

8. A transformer apparatus according to claim 1, wherein the AC-link provided by the compensating circuit is a DC-blocking AC-link between the terminal of the primary winding and the terminal of the secondary winding.

9. A transformer apparatus according to claim 1, wherein the compensating circuit comprises the wire portion coupled in series with the at least one coupling capacitor.

10. A transformer apparatus according to claim 9, wherein the wire portion of the compensating circuit comprises at least half a winding positioned in a projection of a coil of the primary winding and oriented perpendicular to a plane in which the coil is arranged.

11. A transformer apparatus according to claim 9, wherein the wire portion is wrapped to induce the AC voltage between ends thereof in response to the change of the magnetic flux through the primary winding and the secondary winding.

12. A transformer apparatus according to claim 9, wherein the wire portion extends to at least partially enclose a magnetic core around which the primary winding and the secondary winding are arranged.

13. A transformer apparatus according to claim 10, wherein a direction of the winding of the wire portion of the compensating circuit is oriented to provide a polarity of the AC current resulting from the induced AC voltage in the compensating circuit opposed to a polarity of the parasitic AC current that is caused by the inter-winding capacitance between the primary winding and the secondary winding.

14. A transformer apparatus according to claim 1, wherein the at least one coupling capacitor of the compensating circuit comprises a capacitance which is selected to cause the AC current to be at least 50% of a magnitude of the parasitic AC current that is caused by the inter-winding capacitance.

15. A transformer apparatus according to claim 1, wherein one side of the compensating circuit is coupled to the terminal of the primary winding and wherein an other side of the compensating circuit is coupled to the terminal of the secondary winding.

16. A transformer apparatus according to claim 15, wherein the at least one coupling capacitor of the compensating circuit is positioned where a distance between the at least one coupling capacitor and the terminal of the secondary winding is smaller than a distance between the at least one coupling capacitor and the terminal of the primary winding.

17. A transformer apparatus according to claim 1, wherein the primary winding and the secondary winding are arranged around a center leg of an E-core and are formed by coils disposed on a printed circuit board, and wherein the compensating circuit comprises the wire portion which extends at least through a spacing between the center leg and one of other legs, wherein a connection of the compensating circuit to the primary winding and a connection of the compensating circuit to the secondary winding are arranged next to opposing sides of the E-core, and wherein the compensating circuit further comprises a single wire trace corresponding to the wire portion on the printed circuit board with the at least one coupling capacitor.

* * * * *